Feb. 27, 1968 K. S. ETTRE 3,371,001

METHOD OF APPLYING UNIFORM THICKNESS OF FRIT ON SEMI-CONDUCTOR WAFERS

Filed Sept. 27, 1965 2 Sheets-Sheet 1

INVENTOR.

KITTY S. ETTRE

Feb. 27, 1968 K. S. ETTRE 3,371,001

METHOD OF APPLYING UNIFORM THICKNESS OF FRIT ON SEMI-CONDUCTOR WAFERS

Filed Sept. 27, 1965

2 Sheets-Sheet 2

INVENTOR.
KITTY S. ETTRE

United States Patent Office 3,371,001
Patented Feb. 27, 1968

3,371,001
METHOD OF APPLYING UNIFORM THICKNESS OF FRIT ON SEMI-CONDUCTOR WAFERS

Kitty S. Ettre, Norwalk, Conn., assignor to Vitta Corporation, Wilton, Conn.

Continuation-in-part of application Ser. No. 377,998, June 25, 1964. This application Sept. 27, 1965, Ser. No. 495,016
12 Claims. (Cl. 156—234)

This invention relates to a new process of passivation encapsulation, protective and dielectric layer formation of semiconductor and integrated circuit devices, making circuits therefrom, providing connections to other circuit elements. This invention is a continuation in part of the invention filed under Ser. No. 377,998, filed June 25, 1964. That application is incorporated herein by reference.

Specifically I discovered a new and improved process of passivation, encapsulation, protective and dielectric layer formation on semiconductor and integrated circuit devices. This new process is a new use of the transfer tape technique, to produce thin glass, glaze or ceramic layers on semiconductor or integrated circuit devices, to protect their sensitive elements from the environmental damages during fabrication or life and also to provide simple means of packaging and connecting said devices to other devices or elements and also to produce thin insulating dielectric films to serve as the basis of other subsequently deposited elements.

The preparation of silicon wafers for transistor and integrated circuit purpose ready for passivation or insulator or dielectric layer formation is per se known and is not claimed in this invention. Furthermore, the preparation of glazing or ceramic transfer tapes is fully shown and described in my co-pending application. The Ser. No. of which is No. 377,998, filed June 25, 1964.

Previously SiO was evaporated in vacuum to passivate semiconductors and integrated circuits or to form electrical insulator or dielectric layer as basis of other deposited elements. Disadvantages of this process are widely known today. The SiO deposition by evaporation of the material in vacuum is costly, slow and tedious process, and the produced layer has usually a number of imperfections detrimental to the final device. Thin glass layers were also attempted to be utilized on semiconductor and integrated circuit devices for replacing the tedious SiO process and for encapsulation purposes. In this technique the glass frit first was suspended in a liquid and was spread over the semiconductor wafer, before it was cut into chips. This spreading of the fine glass frit was performed e.g. by sedimentation. This glass frit layer spread from a liquid on the semiconductor surface is then dried and subsequently heated to an elevated melting temperature to provide a thin glass or glaze layer when solidified. The disadvantage of this liquid suspension technique is also widely known today. The glass frit spread by means of the most careful liquid process is also non-uniformly distributed over the surface. Differences in non-uniformity of the thickness of the resulting glass layer is disadvantageous and detrimental for many aspects. Non-uniformity of the thickness of the glass layer causes difficulties by producing cracks over the surface, it is also very disadvantageous that when etched, this glass layer in order to produce contacts to the base. This etching through the different thickness glass layers can cause undercutting of the thinner sections or not complete etching through the thicker part of the unevenly deposited glass layer. Glazing is therefore presently not used for the above purposes, except in certain very restricted applications. Irreproducibility of layer thickness however restricts these applications only to laboratory experiments and manufacturing processes are tedious, costly or not realizable.

Encapsulation or further interconnections of said transistor and semiconductor devices produced by the SiO coating technique were made, by soldering the transistor or integrated circuit chips into the circuit or connections were made by means of wires to the proper electrodes, connecting the conductive terminations freed by means of etching from the isulating $SiO_2$ layer on the transistor surface by welding procedure to said terminations. This encapsulation or interconnection is also very tedious and very costly.

It is an object of this invention to provide an improved process to produce extremely uniformly thin and dense glass film on a semiconductor chip or wafer.

It is another object of this invention to provide a process to produce multilayer circuits by utilizing thin and dense transferable glass or dielectric ceramic tapes to produce the protective, insulating encapsulating or dielectric layer on a semiconductor wafer.

It is further object of this invention to provide a process to passivate semiconductor wafers by the application and subsequent melting and cooling a glass transfer tape.

It is another object of this invention to provide a process utilizing transfer tapes to encapsulate electrical circuits formed on a semiconductor wafer.

It is a further object of this invention to provide a glazing process of semiconductor wafers utilizing the transfer tape technique suitable for automation.

It is another object of this invention to utilize the transfer tape technique to produce glazed silicon wafers at atmospheric pressures.

Another object of this invention is to provide a process to passivate semiconductor or integrated circuit devices by utilizing a transferable glass or ceramic tape and to provide interconnections to said semiconductor or integrated circuit device, by etching holes at specified points into the glaze or ceramic layer.

Other objectives and advantages of the invention will appear hereinafter from the following description taken in connection with the accompanying drawings, where:

Figure 1:
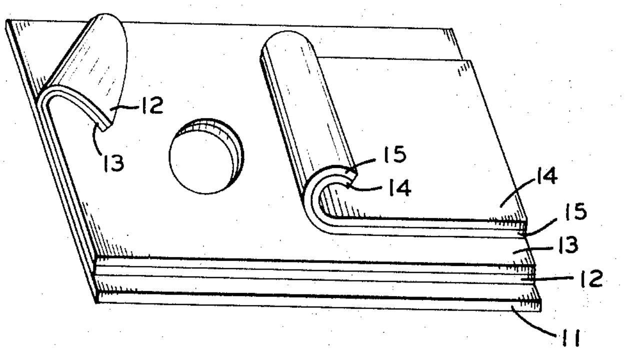
FIGURE 1 illustrates the structure of a configuration of a glass, glazing or dielectric film and its removability from its carrier film.

The improved process of encapsulation or passivation or dielectric layer formation, furthermore the productions of interconnections to semiconductor or integrated circuits are made according to my invention in the following way:

In accordance with the objective of this invention, I have utilized the transferable tape technique for producing a very satisfactory film for use in glazing of semiconductors or other precious surfaces, or for use in formation of dielectric or insulating layers on semiconductor or composite surfaces.

A suitable glass frit or ceramic material or a combination thereof is mixed with suitable binder and plasticizer and a transferable tape is prepared according to the transfer tape process. This transferable glass frit or ceramic tape is prepared as described in my co-pending application Ser. No. 377,998, filed June 25, 1964.

A slurry containing selected glass or ceramic powders or a mixture of them, binder, plasticizer and solvent is deposited on a carrier film in a uniformly thick and smooth layer in a manner described in the co-pending application.

The preparation of transferable tape having the above properties and useful for semiconductor or integrated circuit glazing or protective coating is fully discussed in the above co-pending application.

The carrier film to which the heavily loaded layer containing the glass or ceramic frit is removably attached, must be inert towards organics and inorganic materials used for the film preparation and for the adhesives. The carrier film must possess good mechanical properties. The carrier film must have uniform surface characteristics so that the heavily loaded film can be uniform and its release during transfer should be accomplished in a uniform manner. It was found that several carriers are suitable for this purpose. For example, such carriers are polyethylene, Teflon, paper, or film such as Mylar or Tedlar produced by Du Pont Company.

The heavily loaded film contains the powder material of the glass or ceramics or mixture of them, the binder and the plasticizer. In the glazing of semiconductors and integrated circuits it was found for example, that the role of the binder and the plasticizer is of considerable importance. The binder and plasticizer used in such a transferable layer for glazing semiconductor or integrated surfaces must have no adverse effect on the elements of said surfaces. Such diverse effects could be the deposition of carbon during the glazing process or chemical reaction between the organics and the circuit elements. I have found that over the common organic resins having better film forming characteristics polyvinylalcohol and polymethacrylates give particularly excellent results as binders. For example, for using poly-n-butyl methacrylate as a binder it is possible to prepare high density glazing film with as little as about 2% binder and the resultant film will be substantially unaffected by light or aging. Not more than 25% binder is preferred for the best results. I find in this respect that the transition from the carrier to the object to be coated is influenced to a considerable degree by the binder, its concentration and also by the plasticizer.

It is desirable in many cases that the binder completely decomposes or evaporates during the process so as to leave no solid residue in the coating. This is particularly true in connection with the manufacture of micro-circuit components where residue may become a deleterious contaminant. In such cases e.g. polymethacrylates are particularly desirable as binder because during the glazing under the heat cycle the polymethacryates leave as gaseous products with practically no solid organic residue remaining in the coating.

A plasticizer is used as a part of the binder to give the film a softening effect without affecting the other properties of the film. It is preferable here that the plasticizer similar to the resin should also leave the layer at elevated temperature without leaving an organic residue or should have any harmful effect on the powder material in the film or on the substrate on which the film is deposited. In accordance with this invention plasticizers such as sucrose acetate isobutyrate, dibutyl phthalate, and diethyloxalate may be used successfully with poly-n-butyl methacrylate and glycerine with polyvinylalcohol.

It was found that for transferable tapes a ratio of 85% solid powder, 9% binder and 6% plasticizer gave satisfactory results. In another example, when 94% solid powder was used the tapes utilized to be transferred contained about 4% binder and 2% plasticizer. These composition changes are made if types of different transfer tape characteristics are prepared. It is understood that the above examples and ratios are not limiting the process and other ratios and amounts can as well be used to achieve transfer effect of tapes.

The solvent utilized to produce the slurry to prepare transferable films can be acetone, but amyl acetate, benzene or water may also be used. It was found that the mixture of different compatible solvents such as acetone and ethyl alcohol are very useful and the casting of films with different thickness values require a different composition of these solvents.

The glazing tape described above can be applied to a semiconductor wafer surface by first separating it from the carrier film and using it as a self-supporting film or it can first be applied to the semiconductor surface after which the carrier may be removed. The glazing film itself may be secured to the semiconductor surface by simply pressing by thermal sealing or by the use of a suitable solvent to form a bond to the substrate and achieve the transfer. This suitable solvent can be of the fast evaporating type or it can be a slow drying material. Both polar and non-polar organic solvents are suitable for use with this technique.

It was found that in certain cases solvents which are inert towards the glazing film can be excellently as well used. Such solvent is, for example, water, cyclo hexanol or ethyl alcohol.

I found that in connection with glazing transferable tapes, pressure sensitive adhesives can be used to facilitate the transfer. I found that different types of slurries can be spread on the transferable tape which are generally known for very lasting adhesive qualities. The criteria of spreading such adhesive layers onto the transferable tape surface is that the solvent of the adhesive slurry should be wetting the surface of the transferable tape and that it should not dissolve any of the plastics or plasticizers used in the preparation of the transferable heavily loaded tape.

Another criteria of this adhesive is that it should completely decompose or evaporate at higher temperatures. It should leave the transferred layer without causing open holes, cracks or any other residues which may be harmful on the layer or on the substrate circuit elements. It should not contain any material which may attack the powders dispersed in the transferable tape or the carrier, or the circuit elements. I found that several types of such adhesive slurries could be successfully used in combination with glazing or ceramic dielectric transferable tapes. Such adhesives can be water base, solvent base or water or solvent base types. In particular I found starch, polyvinylalcohol, synthetic rubber and acrylate types very useful but other types can be used as well.

An example of a transferable tape according to this invention is shown in FIGURE 1. This figure illustrates the structure of a configuration of a glass glazing or dielectric transfer tape and its removability from its carrier film.

Figure 2:
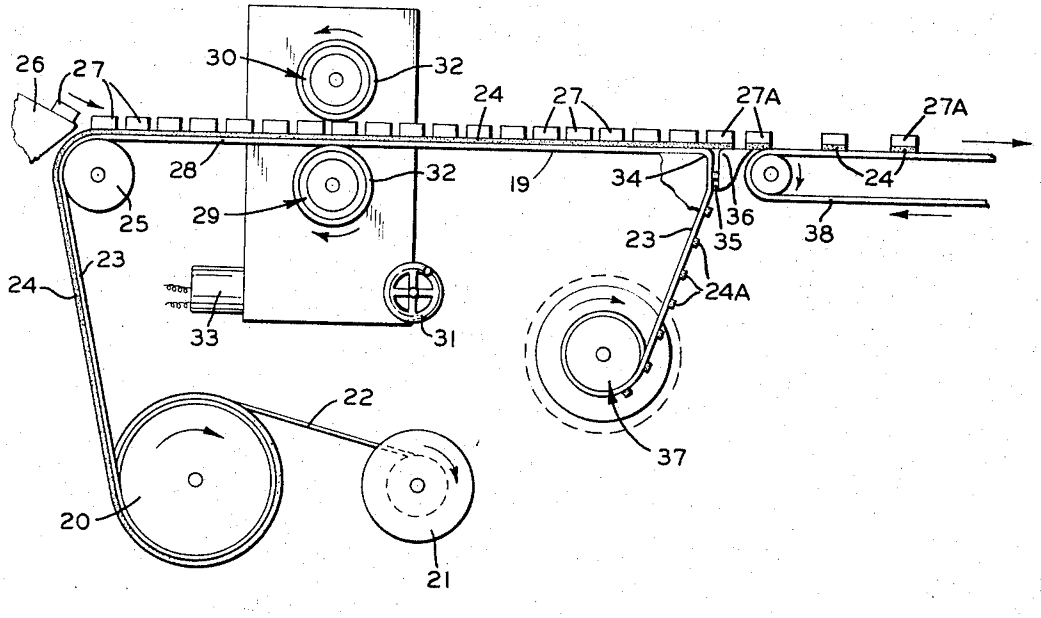
FIGURE 2 is a schematic of a tape transfer machine and its utilization for transferring glazing, encapsulating or dielectric layer forming tapes to semiconductor, or integrated circuit devices.

In this figure, 11 shows a carrier film from which the transferable tape 12 is partially removed. The adhesive layer 13 however is still firmly attached to the transferable tape. In this embodiment of the transferable tape a protective layer 14 is shown partially removed from the adhesive surface of the transferable tape. This protective layer 14 is equipped with a release layer 15 which is firmly attached to the protective layer 14. This protective and release layers are used only to keep the transferable tape clean before its use. This figure shows also a place where a round-shaped pattern was already transferred to a silicon wafer substrate according to this invention. The utilization of such a transferable tape for the passivation and encapsulation for protective and dielectric layer formation on a semiconductor and integrated circuit device may be performed utilizing the following process: The silicone or germanium wafer or any other type of flat microcircuit structure is brought in connection with the adhesive side of the transferable tape a slight pressure is applied so that the silicon or other semiconductor or integrated circuit wafers are adhering to said transferable tape layer. By pulling the carrier film over an edge of a table those parts of the transferable tape which are in connection with the wafer to be coated are now adhering to the silicone wafer and are released from the carrier film. The transfer of the uniform transferable tape from its carrier to the silicone wafer to be coated, can be performed by a hand operation as described above or by using a simple tape transfer machine. Such a tape transfer machine is fully disclosed in a co-pending application, Ser. No. 422,135, filed Dec. 30, 1964. The principle of such a machine and its utilization for transferring glazing and other types of transferable tapes to semiconductor or integrated circuit devices is shown in FIGURE 2. Referring to FIGURE 2, the function of such a tape transfer machine for coating semiconductor or integrated circuit wafers can be described as follows: The transfer tape comprising e.g. the carrier film, the removably attached transferable film coated with an adhesive and the protective paper is mounted on reel 20. There is another reel 21 provided to wind up the protective paper 22 removably attached to the transfer tape. The transfer tape comprising now of the carrier 23 and the transferable tape with its adhesive coating 24 is then led over a guiding roller 25 onto the loading zone. The loading zone contains a feeding means 26 from which the parts to be coated 27 are fed onto the adhesive coated side of the transfer tape which now continues on a flat table 28 which table 28 is a part of the feeding means and which table supports the tape; however, it can also be used for loading the parts 27 in absence of feeding means 26. The tape 23, 24 then carries the parts through the pressure roller 29, 30. The gap between the lower pressure roller 29 and upper pressure roller 30 can be adjusted and indicated by a gap adjustor 31. The material of the pressure rollers may be varied according to the nature of the parts to be coated and their shape. I found that the rollers can be made of stainless steel, or a metal coated with a plastic, rubber or ceramic shell. The rollers 29, 30 shown in FIGURE 2 are of stainless steel coated with rubber layers 32 suitable for tape transfer to wafers. One or both of the rollers may be driven by a motor drive 33 which motor is also used to drive the reels of the machine. The parts 27 passing through the pressure rollers 29, 30 are riding now attached to the transfer tape. The pressure of the rollers is adjusted by the gap adjustor 31 to obtain optimum tape transfer. The parts now because of the applied pressure are strongly adhering to the adhesive side of the transfer tape and proceed on the tape on a flat table 19 to the release mechanism. The release mechanism contains two metal pieces 34 and 36 having sharp corners and are separated by a narrow gap 35. The transfer tape is guided between the two metal edges 34 and 36 through the gap 35 and is attached to the rewind reel 37. In operation the rewind reel 37 pulls the transfer tape 23, 24 under tension through the gap 35 over release edge 34. The parts 27 firmly pressed onto the transfer tape 23, 24 are continuing to proceed over the gap 35, and the transferable layer 24 adhering stronger to the part 27 than to the carrier 23 and, therefore, on the places where pressure was applied release from the carrier 23 when it is pulled over a sharp release edge 34 and continues to adhere to the part 27 which is stripped by the outer release edge 36 when riding over the narrow release gap 35. The remainder of the transferable tape 24A which was not contacted by a part 27 and was not pressed continues through the gap 35 attached firmly to the carrier 23. The parts now coated 27A and released from the transfer tape when leaving the release edge 36 of the release mechanism may be collected. It is permissible as shown in the figure to use a production belt 38 to carry the coated parts to further processing such as firing. The reels such as the tape reel 20, paper windup reel 21, and rewind reel 37 are driven or pulled by any conventional means not shown in this figure connected to drive means 33 to insure a continuous movement of the transfer tape and its constituents. The release mechanism or at least one of its members such as the inner release edge 34 may be also vibrated to facilitate the release but in most cases it was found that vibrating of the release mechanism is not necessary to obtain an excellent release.

The next step in the process of manufacturing semiconductor or integrated circuit wafers after they were coated with protective, glazing or dielectric tape is to put these wafers through a firing cycle. Semiconductor or integrated circuit wafers coated with the thin transferable tape are loaded into an oven and baked subsequently according to a predetermined firing cycle. This firing cycle is such that it allows time for the decomposition of the inorganic materials included in the transferable tape and after that the uniform melting of the glass frit or sintering of the ceramic dielectric is accomplished. In my experience, I found that several glass layers are very useful for glazing semiconductor wafers. As an example, it can be mentioned glass frits having no alkaline content but having only lead oxides, aluminum oxides, silicon oxides, magnesium oxide, or other alkaline free oxide or a mixture thereof. Among dielectrics, useful films were achieved utilizing titanates, niobates or other oxides of the transition elements or a mixture of these oxides with elements of the first group. The baking temperature and baking cycle is different for each of the above materials or for a combination of thereof.

Figure 3:
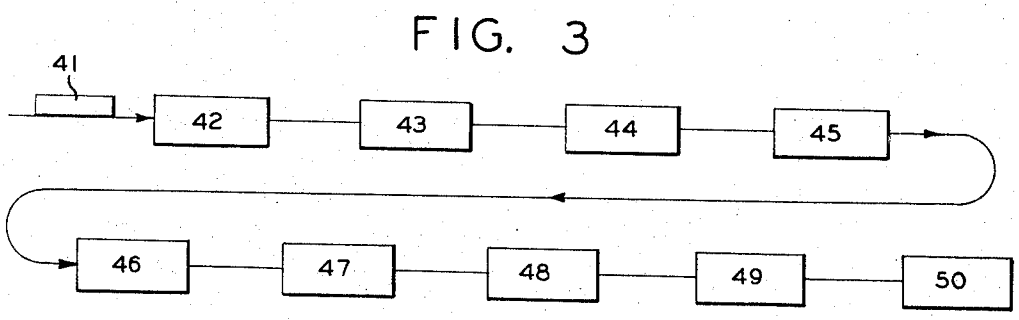
FIGURE 3 is a flow chart of the semiconductor and integrated circuit preparation process.

Having the proper binders, plasticizers and the proper firing cycle thin glass layer is achieved on the semiconductor surface which is free from any defects such as pin holes, cracks, and is uniformly thin over the entire semiconductor or integrated circuit wafer. The next step in the preparation of integrated circuits according to this invention is the etching of various holes into this glass or dielectric film. The etching procedure I found can be accomplished by any of the standard chemical etching procedures used in connection with the presently used SiO layers. This procedure contains the covering of the glazed wafer by a photo resist film exposing the layer to light through a mask so that some areas are illuminated others are not when exposed to light. According to the photo resist technique, the photo resist material can be released from areas not illuminated and the areas illuminated became acid resistant. Exposing now the wafer to fumes of acids or to liquid containing for example HF, the exposed glass area is dissolved and the glass layer is etched through. Stopping this etching procedure can be achieved by neutralizing the acids. The remaining photo resist is washed off by a suitable solvent. The layer is now ready for the next step of integrated device or semiconductor preparation process which could be the attachment of leads. This step can be achieved by a technique using wires and bonding them by pressure to the contacts freed now from the glass or a soft metal such as indium alloy can be inserted in these etched holes on the glass layer and then it can be pressed against connections on an evaporated circuit board. The slicing up of the wafer can be performed before or after the connections are attached. FIGURE 3 demonstrates the flow chart of the above described process. The process utilizes the wafers or chips 41, prepared according to some established integrated circuit manufacturing process. Such a process is per se known, includes such steps as polishing of the wafer and exposing certain areas of said wafer to gases or liquids containing materials which when interacting with said silicone materials, develop impurities inside such wafers to alter their electrical properties. After proper processing at elevated temperature, such wafers develop one or more such altered electrical characteristic spots and before the next step in production is performed, the layers are usually exposed to a process utilizing SiO evaporation to form a protective layer on top of the said developed elements. This SiO evaporation is now eliminated by utilizing the tape transfer glazing according to this invention.

The ready silicon wafer is pressed against the tape, the thickness of which can be very exactly selected by producing the tape in a proper and protected thickness. This thickness selection can be performed for each type of semiconductor device by producing different thicknesses and making firing experiments. This way the normal thickness can be selected which provides a continuous smooth film layer. This is necessary because different semiconductor wafer devices have different surface properties, due to changes in surface smoothness and also by possible changes in the surface properties effecting their surface tension. Having a wafer with different smoothness and different surface properties the glass tape thickness requirements has to be changed accordingly. On a very smooth surface having proper surface qualities a very thin layer glaze or dielectric less than one mil thick can be deposited as discussed in my above-identified co-pending application, Ser. No. 377,998. I found that such glaze can be made as thin as 2 microns while on other devices a heavier protective layer is advisable for their environmental conditions or because of their surface properties. Various thickness is also required in dielectric or resistive layers to achieve the required electrical characteristics.

The wafer 41 according to this invention is brought in this novel process in contact with a suitable transferable tape containing the glazed frit as described previously. This step when the wafer is brought in contact with the adhesive layer of the transferable tape, and pressed onto it, with suitable pressure is indicated as the next step of the process, 42. After this step the carrier of the transferable tape is removed, 43, leaving the suitably thin glass frit layer on the semiconductor wafer. After this step the wafer is now ready for the fusing of the glaze which is performed during the firing 44 cycle. This firing cycle contains a rising and a descending temperature cycle the latter one the cooling cycle is indicated as 45. After the glazed semiconductor made according to this process is cooled, masking of those areas of the glass layer which should not be removed is performed, 46. After this masking, those parts which are not masked will be etched out with a suitable etching solution or vapor in the next step 47, after the etching step, the rinsing, 48, of the wafer takes place which is followed by a drying, 49, step. After this step the wafer is ready for slicing or for further interconnection. Interconnection 50 can be performed by pressure bonding of a wire to the exposed areas or can be performed by deposition a material in the holes of the glass which were etched in step 47 or this interconnection can be made also by utilizing soft metal compressed into the hole or a combination of the above mentioned possibilities. If the interconnection is only between two elements on one wafer, then this interconnection can again be protected by a new glaze, repeating steps 42, 43, 44, 45. If more interconnections are necessary, then the process continues by repeating all steps from 42 through 50 inclusive.

Figure 4:
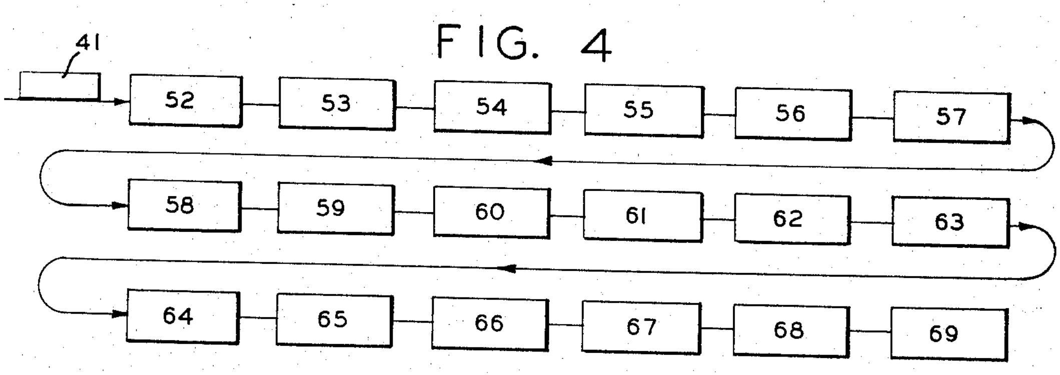
FIGURE 4 is a flow chart of a multilayer semiconductor and integrated circuit preparation process.

Another embodiment of this process is shown in FIGURE 4. In this embodiment, the semiconductor wafer or chip 41 is brought in contact with the pressure sensitive glazing transfer tape 52, the carrier is removed in the steps 53, the layer if fired onto the wafer 54, the wafer is cooled, 55, and after cooling, a masking 56, etching 57, rinsing 58 and drying 59 steps are followed. After this step, the conductive interconnection is deposited, 60, on said wafer by e.g. evaporating conductive materials, into the holes of the glass layer which were prepared by etching during the steps 52 through 59. This is now followed by producing resistor or capacitator layers on said semiconductor layers. In this process, the formation of a resistor film is shown as step 61 which is then followed by a step applying another transferable glass or ceramic frit layer 62 which is followed by another firing operation 63 followed by a cooling of the wafer 64 and followed by a masking 65, etching 66, rinsing 67, and drying 68 which is again followed by step of connecting 69 in the newly developed holes in the new glass or ceramic frit layer to other circuit elements.

The transfer of the glazing or dielectric transferable tape to the wafer can be performed before the wafer is sliced up this way producing many circuit elements in one step or can be performed on a single wafer producing only one element or a combination device at a time.

Figure 5:
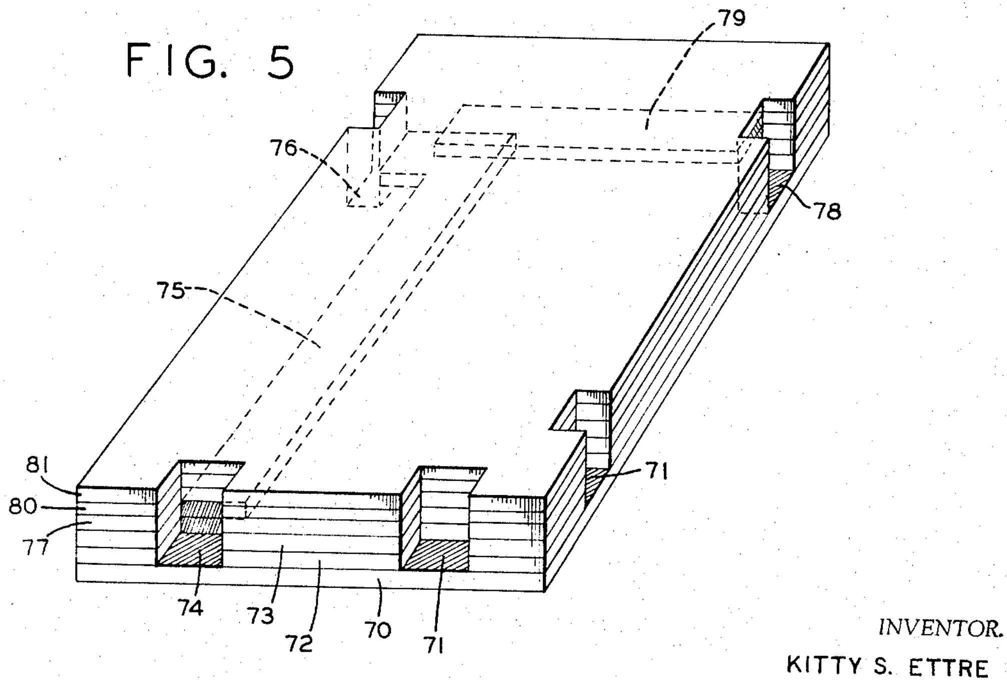
FIGURE 5 is a schematic of a multilayer semiconductor and integrated circuit.

An example of a semiconductor or integrated circuit device according to this invention is shown in FIGURE 5. This figure illustrates a configuration of such a device. In this figure the semiconductor wafer 70 is prepared and equipped with elements on its surface having different electrical characteristics and forming a part of a circuit. Five conductive terminals, 71, 71, 74, 76 and 78 were equipped with conductive paths, leading to the circuit elements prepared on the semiconductor 70. On this wafer 70 a glaze layer 72 is prepared in accordance with this invention. This layer is etched at the terminations 71, 71, 74, 76 and 78. A resistive path 75 is deposited now between terminations 74 and 76. This path 75 is surrounded with a glass layer 73 and the layer 73 and the resistive path 75 are covered with a dielectric layer 77. In this dielectric layer a conductive layer 79 is deposited originating at the conductive terminal 78 and running above resistor element 75, separated from it by the dielectric layer 77, forming this way a capacitor, which is tied through terminals 78 and 75 respectively to the semiconductor integrated circuit on wafer 70. This conductive path 79 is surrounded by an insulator layer 80 and the entire circuit is protected by a glaze layer 81. The sequence of preparation of this circuit may include etching of the conductive terminal after the first or after any subsequent glazing operation. This may be followed by the precipitation of a conductive layer in said terminals. After the circuit is completed these terminals are then connected as described above to other circuit elements. This circuit may be prepared in one or more steps.

From the foregoing is will be apparent that novel means and methods have been presented in accordance with the objectives of this invention for a process to produce semiconductor and integrated circuits by means of a transfer tape process. It is to be understood, however, that various changes in the means and methods described may be made by those skilled in the art but not departing from the spirit of the invention as expressed in the accompanying claims.

I claim:

1. A method of coating a plurality of semiconductor wafers with a friable frit in the form of a layer about one mil or less thick, which comprises: pressing a transfer tape comprising a carrier base and the coating of said layer onto the surface of the semiconductor wafers between a pair of rollers and thereafter stripping the carrier and its unused coating away from said wafers, resulting in a frit coating of uniformly applied thickness.

2. The method defined in claim 1 wherein said transfer tape and said wafers are continuously fed between said rollers.

3. The method defined in claim 1 wherein said transfer tape further comprises a protective layer over said frit layer, which protective layer is removed from said transfer tape prior to feeding it and said wafers between said rollers.

4. The method defined in claim 1 wherein the surfaces of said wafers are substantially flat and are pressed in their entirety against said frit layer between said rollers whereby the entire surface of each of said wafers is covered with said frit coating.

5. The method defined in claim 1 wherein said frit layer comprises a friable frit suspended in an organic film-forming binder; and:

(A) said frit is chosen from the group consisting of semiconductor compatible glasses, metals and transition element oxides;

(B) said organic binder is chosen from the group consisting of polyvinylalcohol and polymethacrylates; and (C) said plasticizer is chosen from the group consisting of sucrose acetate isobutyrate, dibutyl phthalate, diethyl-oxalate and glycerine.

6. The method defined in claim 5 wherein said transferring step is facilitated by an adhesive layer spread on said releasable layer comprising an adhesive chosen from the group consisting of starch, polyvinylalcohol, synthetic rubber and acrylate adhesives.

7. The method defined in claim 5 wherein said binder is poly-n-butylmethacrylate.

8. The method defined in claim 7 wherein said binder comprises not more than substantially 25% by weight of said layer.

9. The method defined in claim 5 wherein said binder comprises not more than substantially 25% by weight of said layer.

10. The method defined in claim 9 wherein said plasticizer comprises approximately 2 to 6% by weight of said layer.

11. The method defined in claim 5 wherein said plasticizer comprises approximately 2 to 6% by weight of said layer.

12. The method defined in claim 5 wherein said transferring step is facilitated by a pressure sensitive adhesive layer spread on said releasable layer.

References Cited

UNITED STATES PATENTS

| | | | |
|---|---|---|---|
| 2,311,876 | 2/1943 | Scheetz | 117—46 |
| 2,776,235 | 1/1957 | Peck | 117—36.1 |
| 3,062,676 | 11/1962 | Newman et al. | 117—36.4 |
| 3,189,504 | 6/1965 | Whittle et al. | 156—234 |
| 2,899,344 | 8/1959 | Attalla et al. | 156—17 |
| 3,210,225 | 10/1965 | Brixey | 156—17 |

JACOB H. STEINBERG, *Primary Examiner.*